United States Patent
Robert et al.

(10) Patent No.: US 9,631,952 B2
(45) Date of Patent: Apr. 25, 2017

(54) CAPACITIVE MICROELECTRONIC AND/OR NANOELECTRONIC DEVICE WITH INCREASED COMPACTNESS

(71) Applicant: Commissariat a L'Energie Atomique et aux Energies Alternatives, Paris (FR)

(72) Inventors: Philippe Robert, Grenoble (FR); Loic Joet, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 153 days.

(21) Appl. No.: 14/720,282

(22) Filed: May 22, 2015

(65) Prior Publication Data

US 2015/0338246 A1  Nov. 26, 2015

(30) Foreign Application Priority Data

May 26, 2014 (FR) ...................... 14 54734

(51) Int. Cl.
*H01G 5/14* (2006.01)
*G01D 5/241* (2006.01)
(Continued)

(52) U.S. Cl.
CPC ......... *G01D 5/2417* (2013.01); *B81B 3/0021* (2013.01); *B81C 1/00134* (2013.01);
(Continued)

(58) Field of Classification Search
CPC .................... H01G 5/16; H10G 5/14
See application file for complete search history.

(56) References Cited

U.S. PATENT DOCUMENTS

| 7,250,353 | B2 | 7/2007 | Nasiri et al. |
| 2003/0039089 | A1* | 2/2003 | Lee .................. G02B 26/0841 361/283.1 |

(Continued)

FOREIGN PATENT DOCUMENTS

| EP | 1 411 024 A2 | 4/2004 |
| EP | 2 066 015 A2 | 6/2009 |

(Continued)

OTHER PUBLICATIONS

Extended European Search Report issued Jun. 24, 2015 in Patent Application No. 15169015.3 (with English translation of Category of Cited Documents).

(Continued)

*Primary Examiner* — Dion R Ferguson
(74) *Attorney, Agent, or Firm* — Oblon, McClelland, Maier & Neustadt, L.L.P.

(57) ABSTRACT

A device with a mobile element extending along a given plane comprising at least one first, one second and one third layers extending in planes parallel to the given plane, with the first layer forming a support, the second layer comprising all or a portion of the mobile element and means for suspending the mobile element with respect to the support and the third layer comprising all or a portion of the capacitive means of which the capacitance varies according to the relative position of the mobile element with respect to the support, said capacitive means comprising at least one mobile electrode integral with one of the faces of the mobile element parallel to the given plane, and at least one fixed electrode with respect to the support, with the fixed and mobile electrodes being arranged at least partially in the same plane parallel to the given plane and at least partially above and/or below the mobile element.

21 Claims, 9 Drawing Sheets

(51) Int. Cl.
   *B81C 1/00* (2006.01)
   *H01G 5/16* (2006.01)
   *B81B 3/00* (2006.01)
   *G01P 15/125* (2006.01)
   *G01P 15/08* (2006.01)

(52) U.S. Cl.
   CPC .............. *G01P 15/125* (2013.01); *H01G 5/14* (2013.01); *H01G 5/16* (2013.01); *B81B 2201/033* (2013.01); *B81B 2203/051* (2013.01); *G01P 2015/0814* (2013.01)

(56) References Cited

U.S. PATENT DOCUMENTS

| | | | |
|---|---|---|---|
| 2004/0081391 A1* | 4/2004 | Ko | B81B 3/0062 385/18 |
| 2006/0228831 A1 | 10/2006 | Nasiri et al. | |
| 2011/0147860 A1 | 6/2011 | Robert et al. | |
| 2011/0169109 A1 | 7/2011 | Langereis | |
| 2012/0171836 A1 | 7/2012 | Sterken et al. | |
| 2012/0210792 A1 | 8/2012 | Robert et al. | |
| 2012/0279299 A1 | 11/2012 | Walther et al. | |
| 2013/0000411 A1 | 1/2013 | Robert et al. | |
| 2014/0177881 A1 | 6/2014 | Fanget et al. | |

FOREIGN PATENT DOCUMENTS

| | | |
|---|---|---|
| WO | WO 2010/029516 A1 | 3/2010 |
| WO | WO 2011/003803 A1 | 1/2011 |

OTHER PUBLICATIONS

French Preliminary Search Report issued Dec. 23, 2014 in French Application 14 54734 filed May 26, 2014 (with English Translation of Categories of Cited Documents).

Jin-Ho Lee et al. "SOI-based Fabrication Processes of the Scanning Mirror Having Vertical Comb Fingers" Sensors and Actuators A, vol. 102, 2002, 8 pages.

Adam R. Schofield et al. "Micromachined Gyroscope Concept Allowing Interchangeable Operation in Both Robust and Precision Modes" Sensors and Actuators A, vol. 165, 2011, 8 pages.

B. Diem et al. "SOI 'SIMOX'; from Bulk to Surface Micromachining, a New Age for Silicon Sensors and Actuators" Sensors and Actuators A, vol. 46-47, 1995, 7 pages.

L. Zimmermann et al. "Airbag Application: A Microsystem Including a Silicon Capacitive Accelerometer, CMOS Switched Capacitor Electronics and True Self-Test Capability" Sensors and Actuators A, vol. 46-47, 1995, 6 pages.

Said Emre Alper et al. "A High-Performance Silicon-on-Insulator MEMS Gyroscope Operating at Atmospheric Pressure" Sensors and Actuators A, vol. 135, 2007, 9 pages.

B. Homeijer et al. "Hewlett Packard's Seismic Grade MEMS Accelerometer" IEEE MEMS, 2011, 4 pages.

* cited by examiner

CAPACITIVE MICROELECTRONIC AND/OR NANOELECTRONIC DEVICE WITH INCREASED COMPACTNESS

TECHNICAL FIELD AND PRIOR ART

This invention relates to a microelectronic and/or nanoelectronic device comprising a mobile portion and a fixed portion and capacitive means of which the capacitance varies with the relative movement of the mobile and fixed portions, with the device able to have increased compactness.

The capacitance change due to the relative movement of the mobile and fixed portions can be used for the detection of the relative movement between a fixed portion and a mobile portion and is for example implemented in microelectromechanical or MEMS (MicroElectroMechanical System) systems used to realise sensors such as accelerometers, gyrometers, magnetometers.

The uses of capacitive MEMS sensors are multiple. The latter are for example used in the automobile, in the general public field as for example in portable telephones, in electronic games, in aeronautics, the medical field, etc.

It is sought not only to reduce the cost of the sensors but also to reduce the size of them, in particular in the automobile and in the consumer field.

An accelerometer comprises a siesmic mass connected to the substrate through flexible beams. Fingers forming electrodes are integral with the siesmic mass and are interdigitated with fingers forming fixed electrodes with respect to the substrate. The sets of fingers are also called "combs". Under the effect on an acceleration, the mobile mass moves in the plane. The relative movement of the seismic mass with respect to the substrate causes a relative movement between the interdigitated fingers, which results in an air gap change and a capacitance change between the fixed fingers with respect to the substrate and the fixed fingers with respect to the inertial mass. The measurement of the acceleration is carried out by measuring this capacitance change.

Conventionally, the fingers extend laterally on either side of the inertial mass. This configuration implies a substantial encumbrance in the plane.

Gyrometers comprise at least two sets of interdigitated capacitive combs. A first set provides the excitation of a first resonant mode and a second set provides the detection of a second vibration mode, orthogonal to the first, which is induced by the Coriolis force exerted on the inertial mass or masses when the sensor is subjected to a rotation.

As the combs are arranged around the inertial mass, the footprint in the plane is even further substantial.

In order to reduce this encumbrance, it was considered to increase the thickness of the inertial mass in order to reduce its footprint in the plane while retaining its mass. However this has for effect to increase the air gap of the interdigitated fingers in order to retain the aspect ratio of the etching in the silicon. Indeed, etching in a more substantial thickness requires openings for the etching that are wider. This results in a loss of electrical sensitivity of the component.

It has been proposed in the document "*Hewlett Packard's Seismic Grade MEMS Accelerometer*"—B. Homeijer, D. Lazaroff, D. Milligan, R. Alley, J. Wu, M. Szepesi, B. Bicknell, Z. Zhang, R. Walmsley and P. Hartwell—*IEEE MEMS,* 2011 to arrange a first set of electrodes under the inertial mass integral with the latter, forming the mobile electrodes, and to add via sealing the other set of electrodes on the cover, forming the fixed electrodes, facing the mobile electrodes. The cover is sealed on the substrate whereon the inertial mass is suspended. The footprint of the sensor in the plane is then reduced. On the other hand, the air gap between the fixed electrodes and the mobile electrodes is determined by the thickness of the sealing, not by a deep etching of the siesmic mass. This results in a substantial air gap, for example much higher than 1 μm, which limits the electrical sensitivity. Furthermore, this air gap is poorly controlled.

DISCLOSURE OF THE INVENTION

It is consequently a purpose of this invention to offer a capacitive device comprising a mobile portion and a fixed portion, offering an increased compactness in the plane.

The purpose of this invention mentioned hereinabove is achieved by a device comprising a mobile portion and a fixed portion, and capacitive means, the mobile portion comprising a mobile element and at least one mobile electrode on its lower face and/or its upper face, the mobile element and the mobile electrode being made in two separate layers and the fixed portion comprising at least one fixed electrode arranged with respect to the mobile electrode in such a way that a movement of the mobile portion causes an air gap change, with the fixed electrode and the mobile electrode being made in the same layer, advantageously simultaneously.

The mobile element can be a siesmic mass or any other mechanical element that can be moved with respect to the fixed portion.

"Layer" means a thickness of one or several materials that can be obtained either in a single step or in several steps, the layer can therefore comprise different materials.

The encumbrance of the device in the plane is reduced.

Since the fixed and mobile electrodes are realised in a layer separate from that of the mobile element, the layer wherein the fixed and mobile electrodes are made can be advantageously thin while that of the mobile element can be thick. A thick mobile element makes it possible to reduce the footprint of the device in the plane at a constant level of precision. When the layer wherein the fixed and mobile electrodes are made is thin, it is possible to create a narrow air gap, for example less than 0.5 μm for a layer of 10 μm, the aspect ratio is then 20. A narrow air gap allows for substantial gains in electrical sensitivity, and to increase the density of the number of electrodes and to further increase the sensitivity.

Since the fixed and mobile electrodes are made using the same layer advantageously simultaneously, the air gap between the electrodes can be created via etching, which allows for good dimensional control of the air gaps.

In other terms, the mechanical portion and the detection portion of the capacitive type of the mobile portion are realised separately, which makes it possible to optimise each one of these portions separately. Advantageously, the fixed and mobile electrodes of the detection portion are carried out in a thickness of material that makes it possible to create narrow air gaps.

Advantageously, the capacitive means comprise several mobile electrodes and several fixed electrodes.

Very advantageously, the capacitive means are of the air gap change type having more sensitivity than those of the surface change type. However, for the applications that require a large movement of the mobile element, the means can be of the surface change type.

Also advantageously, the capacitive means are of the interdigitated comb type, which makes it possible to increase the density of the number of electrodes.

The subject-matter of the invention then is a device with a mobile element extending according to a given plane comprising at least one first, one second, and one third layers extending in planes parallel to the given plane, with the first layer forming a support, the second layer comprising all or a portion of the mobile element and means for suspending the mobile element with respect to the support and the third layer comprising all or a portion of the capacitive means of which the capacitance varies according to the relative position of the mobile element with respect to the support, said capacitive means comprising at least one mobile electrode secured to one of the faces of the mobile element parallel to the given plane, and at least one fixed electrode with respect to the support, the fixed and mobile electrodes being arranged at least partially in the same plane parallel to the given plane and at least partially above and/or below the mobile element.

Preferably, the second layer has a thickness that is greater than that of the third layer, the ratio between the thickness of the second layer and that of the third layer being advantageously at least equal to 2.

The device with mobile element can comprise at least two mobile electrodes and two fixed electrodes which are inter-digitated The third layer can have a thickness between a few µm and a few tens of µm.

In an embodiment, the device with a mobile element comprises at least two mobile electrodes and at least two fixed electrodes arranged in such a way that when the capacitance between a fixed electrode and a mobile electrode increases, the capacitance between the other fixed electrode and the other mobile electrode decreases in order to takes a differential measurement.

According to an additional characteristic, the mobile electrode can be isolated electrically from the mobile element, said device comprising connection means for electrically connecting said mobile electrode. The device can then comprise several mobile electrodes and several fixed electrodes, at least one mobile electrode being connected electrically separately from the other mobile electrodes and/or at least one fixed electrode being connected electrically separately from the other fixed electrodes.

According to an additional characteristic, the fixed electrode can be suspended with respect to the support. In an embodiment, the fixed electrode is suspended with respect to the support between a zone of the support covered by the mobile element and a zone of the support not covered by the mobile element.

Alternatively, the fixed electrode is anchored to the support.

The device with the mobile element can comprise additional capacitive means of which the capacitance varies according to the relative position of the mobile element and of the support, said additional capacitive means being arranged on the one hand in the second layer on at least one first lateral zone of the mobile element and on the other hand on a zone of the support which faces the at least one first lateral zone.

The additional capacitive means can be arranged on the one hand in the second layer on a second lateral zone of the mobile element opposite the first zone and on the other hand on a zone of the support facing the second lateral zone.

The capacitance of the capacitive means can vary when the mobile element is moved according to a first direction and the additional capacitive means are arranged in such a way that their capacitance varies when the mobile element is moved according to a second direction different from the first direction, more preferably the second direction being orthogonal to the first direction.

For example, the capacitive means are means for detecting the relative position of the mobile portion and of the fixed portion.

The capacitive means and the additional capacitive means can form means for detecting the relative position of the mobile element and of the support, or means among the capacitive means and the additional capacitive means can be means for detecting the relative position of the mobile element and of the support and the other means are either means for actuating the mobile element with respect to the support or means for generating a negative electrostatic stiffness on the device.

Another subject-matter of the invention also is a micro and/or nanoelectronic system comprising at least one device with a mobile element according to the invention.

Another subject-matter of the invention also is a method for realising a device with a mobile element according to the invention, comprising the steps of:

A) Structuring a conductive or semi-conductive layer formed on a first substrate in such a way as to form simultaneously at least one mobile electrode and at least one fixed electrode, B) Assembling the first substrate and a second substrate, C) Structuring of the first substrate in order to define the mobile element and the means for suspending, D) Releasing of the mobile element and releasing of the fixed electrode with respect to the mobile electrode.

The method can comprise prior to the step A):
forming a sacrificial layer on the first substrate,
structuring the sacrificial layer,
forming the conductive or semi-conductive layer on said structured sacrificial layer.

The step B) can be a step of sealing for example via molecular adhesion.

The step D) can take place by removal at least partially of the sacrificial layer, for example by etching.

BRIEF DESCRIPTION OF THE DRAWINGS

This invention shall be better understood based on the following description and the annexed drawings wherein.

DETAIL DISCLOSURE OF PARTICULAR EMBODIMENTS

Figure 1:
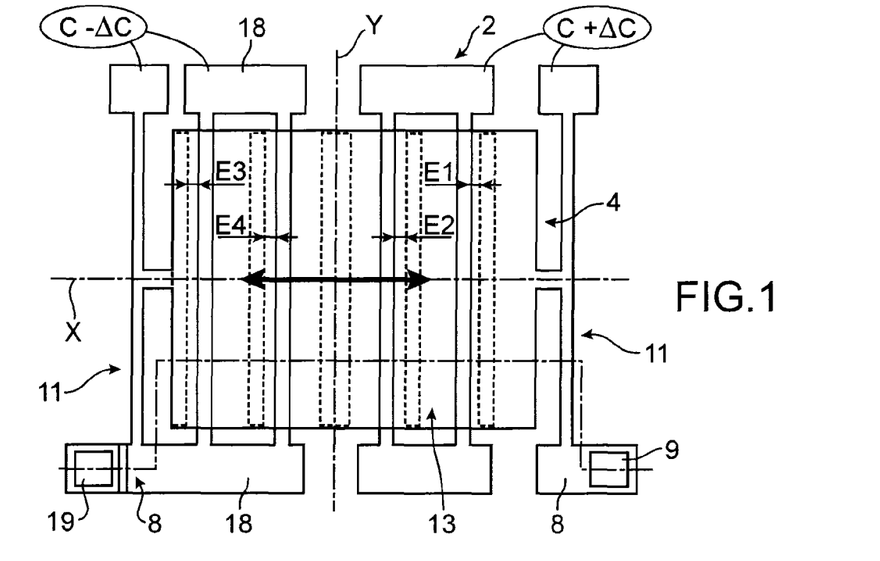
FIG. 1 is a top view of the device of an embodiment of a device according to the invention.
Figure 2:
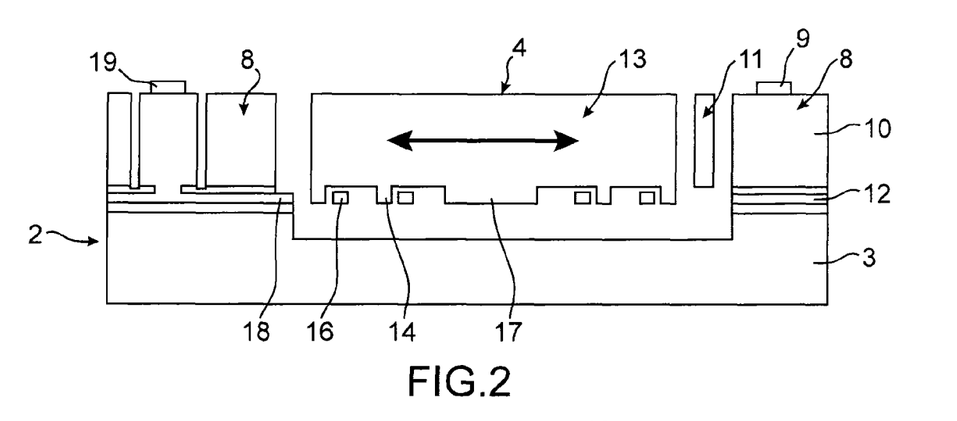
FIG. 2 is a transverse section view of FIG. 1, wherein the electrical connections are diagramed.

FIGS. 1 and 2 show an embodiment of a micro and/or nanoelectronic device with mobile element wherein a capacitance change is measured. For the purposes of simplicity, the latter will be designated solely as capacitive device in the remainder of the description. Moreover, in the following description the fixed or mobile electrodes are used for the purposes of measuring the movement of the mobile element, they shall then be designated as detection electrodes, but as shall be described in what follows, they can be used to actuate the mobile element, i.e. to set it into movement and/or to place it into a given position.

In the example of FIGS. 1 and 2, the capacitive device comprises a fixed portion 2 and a mobile portion 4. The mobile portion 4 is able to move with respect to the fixed portion 2 along a longitudinal direction X.

The fixed portion 2 comprises a support 3 for example formed using a semi-conductive substrate, for example made of silicon and detection electrodes 16 suspended in a fixed manner on the support. The fixed detection electrodes 16 are, in the example shown, in the form of straight beams and extend in a direction Y perpendicular to the direction of movement X and are suspended in a fixed manner on the support 3 at their longitudinal ends by anchoring zones 18. The anchoring zones 18 are, in the example shown, outside of the zone covered by the mobile portion, but one or both of the anchoring zones could be located under the mobile portion 4.

The mobile portion 4 is suspended with respect to the fixed portion 2 by elastic means of return 11, such as two flexible beams in bending which are anchored on the substrate by two anchoring pads 8 arranged on either side of the mobile portion 4 and allowing for a movement of the mobile portion 4 along the longitudinal direction X. The form of the elastic means is in no case restrictive. Furthermore, the mobile portion 4 could move along several directions according to the application.

The mobile portion 4 comprises a first layer 10 and a second layer 12. In the example shown and very advantageously, the first layer has a thickness that is relatively greater than that of the second layer 12. A mobile element 13 is realised in the layer 10, by having a thickness that is sufficient to have the function of inertial mass and the elastic means 11 are formed in this layer 10. The second layer 12 which is relatively thin with respect to the first layer is structured in such a way as to form mobile detection electrodes 14. In the example shown, the second layer 12 is between the support 3 and the mobile element 13, but as shall be seen in what follows, the inverse arrangement does not leave the scope of this invention.

The thickness 10 can be between a few tens of µm and a few hundred µm. The thickness 12 can be between a few µm and a few tens of µm. The ratio between the thickness of the layer 10 and of the layer 12 can be between 1 and 30.

Advantageously, the ratio is greater than or equal to 2, in such a way as to have a thin layer 12 that allows for a certain finesse in the etching and a thick layer 10 in order to form a mass.

In certain applications, the ratio can be about 20 or 30 for example, which makes it possible to retain a mobile element forming the inertial mass and to have very advantageously a thin layer 12 allowing for thin etchings. In other applications, the thicknesses of the two layers are close, the ratio is about 1. The layer 12 wherein the electrodes are formed then participate in the inertial mass. This realisation also offers an increased compactness because the electrodes can be arranged everywhere under the mobile element, not just at the periphery.

According to the invention, as the suspension means are made in the thick layer 10, their stiffness limits out-of-plane motions of the mobile portion and they allow motion of the mobile element in the plane as the suspension means have still suitable yieldingness. This is achieved by setting the form factor. The suspension means look like for example a blade or series blades.

The layer in which the suspension means and the mobile element are made is advantageously mono-crystalline, then the suspension means have a predictable and linear behaviour. In addition etching the suspension means in the layer in which the mobile element is made allows making the layer of the electrodes in deposited polycrystalline silicone. This process is less expensive because less substrate is required and no SOI substrate is required.

The mobile detection electrodes 14 also have the form of a straight beam extending along the direction Y.

The mobile 14 and fixed 16 detection electrodes are arranged in relation to one another in such a way that a lateral flank of a fixed electrode is facing a lateral flank of a mobile electrode. The lateral flank of a fixed electrode and the lateral flank of a mobile electrode define an air gap of variable thickness between them.

The device also comprises at least one electrical contact 9 in order to polarise the mobile detection electrodes 14 and at least one electrical contact 19 in order to polarise the fixed detection electrodes 16.

In the example shown, the mobile element 13 has an extra thickness 17 in a central zone of its lower face, making it possible to increase the mass of the mobile element by using the zones where there is no electrode.

By way of example, the first layer 10 has a thickness between a few tens and a few hundred microns, for example 60 µm, and the second layer 12 has a thickness between a few microns and a few tens of microns, for example 8 µm.

The thickness of the air gap is for example between 250 nm to a few microns, for example equal to 400 nm.

In FIG. 1, an example of an electrical configuration is diagramed providing a differential measurement of the capacitance change.

In the example shown, the device comprises four mobile detection electrodes 14 and four fixed detection electrodes 16, each pair of a fixed detection electrode and a mobile detection electrode delimiting an air gap of which the variation is measured. In the example shown, the two air gaps designated as E1 and E2, located on the right in what is shown in FIG. 1, vary in the same direction, increasing or decreasing at the same time the two air gaps designated as E3 and E4, located on the left in what is shown in FIG. 1, vary in the same direction, decreasing or increasing at the same time, but in a direction opposite to the direction of the variation of the air gaps E1 and E2. These variations in different directions are shown by designating the capacitance of the air gaps E1 and E2 as C+ΔC and by designating the capacitance of the air gaps E3 and E4 as C−ΔC.

The difference of the measurements on the air gaps E1 and E3 for example is equal to 2ΔC.

Note that the fixed electrodes and the mobile electrodes could be arranged in relation to one another is such a way that all of the air gaps vary in the same direction.

Figure 3:
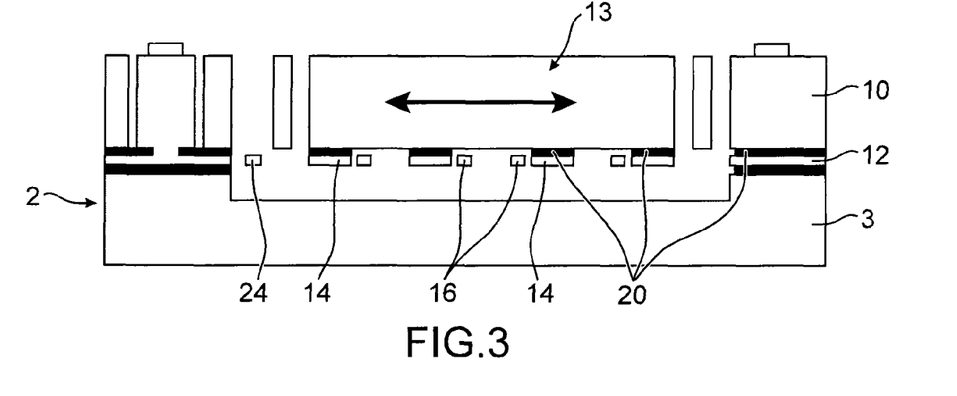
FIG. 3 is a transverse section view of a variant of a device according to the invention.

FIG. 3 shows an alternative embodiment of the device of FIGS. 1 and 2 wherein the mobile detection electrodes 14 are electrically isolated with respect to the mobile element. For this, a layer 20 made of electrical insulating material, for example made of $SiO_2$ is interposed between the layer of the mobile element and the layer of the mobile detection electrodes 14. In order to be able to electrically connect the mobile detection electrodes 14 an electrical connection 24 is provided between the mobile detection electrodes 14 and a contact pad on the substrate. The electrical connection is elastically deformable in order to follow the movements of the mobile detection electrodes 14. Several electrical connections could be provided in order to separately connect the mobile electrodes. Several electrical connections could also be provided to separately connect the fixed electrodes.

It is then possible to polarise differently the different mobile electrodes and/or the different fixed electrodes. This is particularly advantageous in systems where electrodes are used to measure the movement of the mass, and other electrodes are used to drive the mobile element in movement. By polarising these electrodes differently, there are additional degrees of freedom available.

Figure 4A:
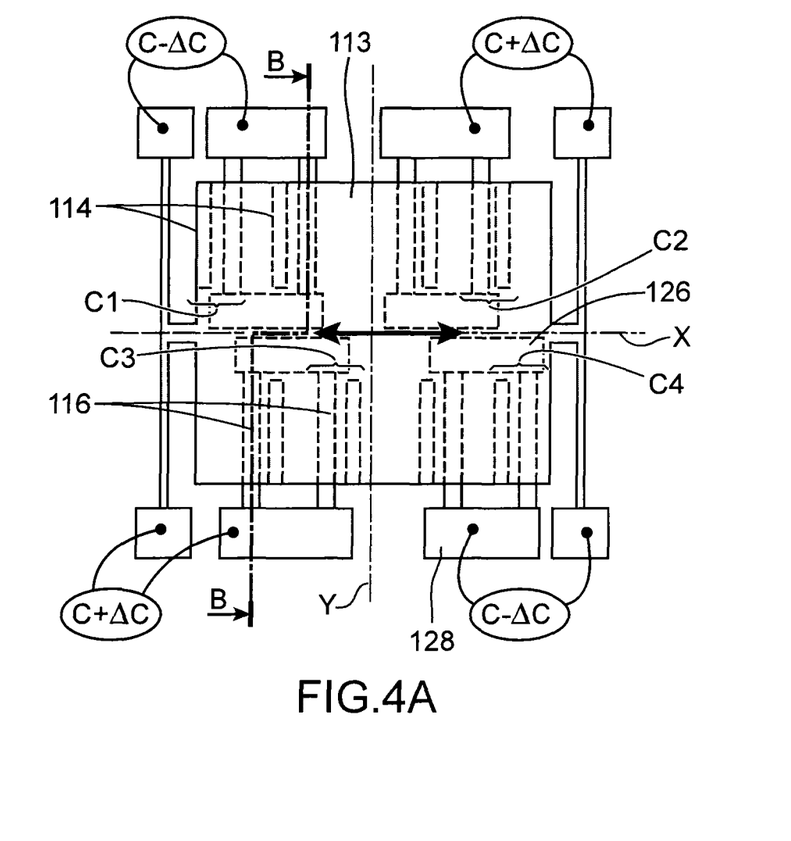
FIG. 4A is a top transparent view of another embodiment of a device according to the invention wherein the capacitive detection is differential and the fixed electrodes are anchored below the mobile element and outside of the mobile element.
Figure 4B:
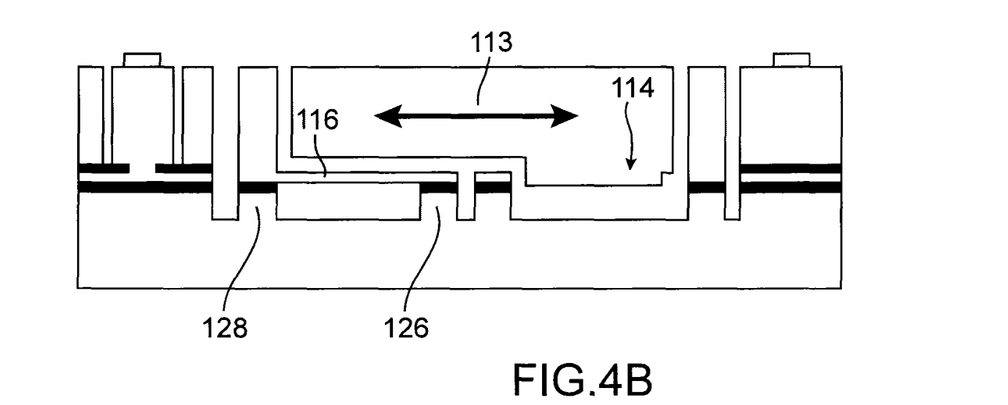
FIG. 4B is a cross-section view along the plane B-B of the device of FIG. 4A.

In FIGS. 4A and 4B, another embodiment of a capacitive device according to the invention can be seen. In this example, a differential measurement can also be carried out.

The capacitive device comprises mobile detection electrodes 114 extending over one portion only of the mobile element 113 in the direction Y. It then comprises four pairs of mobile electrodes 114. As such, the length of the suspended fixed electrodes is reduced, they therefore offer greater rigidity. At a constant rigidity, and therefore deformation, it is then possible to reduce the section of the fingers forming the electrodes, to increase their number and, as such increase the density of the capacitance.

The fixed detection electrodes 116 are suspended, between a zone 126 of the substrate located below the mobile element and a zone 128 located outside of the zone covered by the mobile element (FIG. 4B). The fixed electrodes are distributed in pairs and the electrodes of each pair share the same suspension zones. Each pair of fixed electrodes is associated with a pair of mobile electrodes.

In the example shown in FIG. 4A, an electrical configuration is diagramed. The pairs of associated fixed and mobile electrodes form pairs of capacitors with variable capacitance par air gap change. These pairs are designated as C1, C2, C3 and C4.

The capacitors C1 and C4 vary in the same direction and the capacitors C2 and C3 vary in the same direction, opposite the direction of the variation of the capacitors C1 and C4, this is symbolised by C+ΔC and C−ΔC. It will be understood that this arrangement of the capacitors is not restrictive, and that it could have been provided for example that the capacitors C1 and C3 vary in the same direction and the capacitors C2 and C4 vary in the same direction by arranging the electrodes in a suitable manner.

Alternatively, all of the capacitors could vary in the same direction; this would no longer then be a device with differential capacitive detection.

Figure 5A:
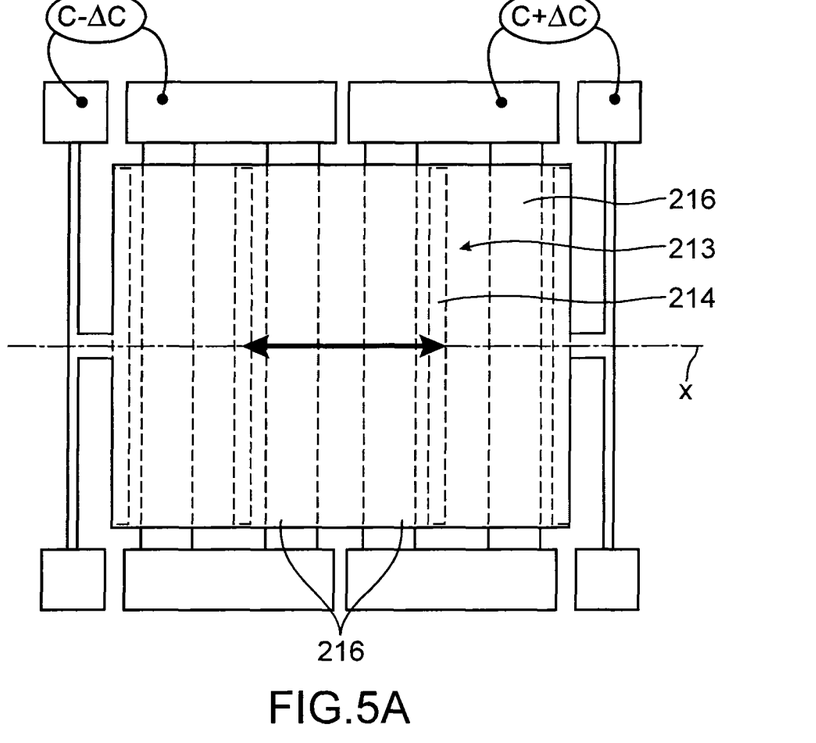
FIG. 5A is a top transparent view of another embodiment of a device according to the invention wherein the capacitive detection is differential and the fixed electrodes are anchored on the substrate.
Figure 5B:
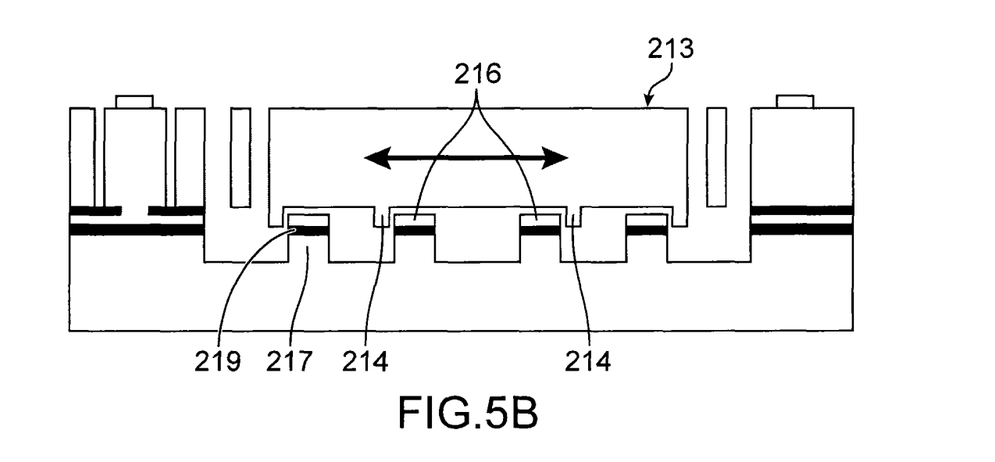
FIG. 5B is a cross-section view along the plane B-B of the device of FIG. 5A.

FIGS. 5A and 5B show another embodiment wherein the fixed electrodes are anchored on the substrate. The rigidity of the electrodes is further increased, which can be interesting in the case of substantial electrostatic forces.

The fixed detection electrodes 216 extend under the mobile element 213 and are integral over their entire length with the support in the zone of the support covered by the mobile portion. In the example shown, the fixed electrodes are wider than the mobile electrodes, this is due to the method of production, where in the support and the fixed electrodes are made in two different substrates. During manufacture, these two substrates will be aligned and placed one on the other. The size of the fixed electrodes makes it possible to take the imprecision into account during the assembly and to offer a sufficient assembly surface. With another embodiment, the fixed electrodes and the mobile electrodes could have the same width.

The fixed electrodes 216 are realised in the same layer as the mobile detection electrodes 214. The fixed electrodes are supported by elements 217 protruding from the support which are etched in the latter.

The fixed electrodes 216 are isolated from the elements 217 protruding from the support by a dielectric layer 219.

Figure 6:
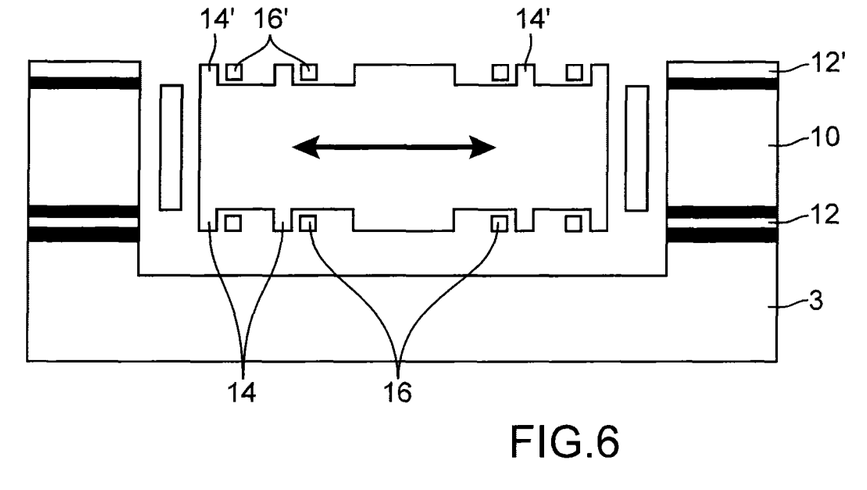
FIG. 6 is a transverse section view of another example of a device according to the invention.

FIG. 6 shows a variant of the device of FIGS. 1 and 2 wherein mobile detection electrodes are provided on the lower face and as well as on the upper face of the mobile portion.

The mobile detection electrodes 14' are made in a layer different from that wherein the mobile element 13 is made. Fixed detection electrodes 16' are also provided facing the mobile detection electrodes 14', the electrodes 16' are made in the same layer 12' as the electrodes 14'. Thanks to this realisation, the number of capacitors with variable capacitance is double without increasing the footprint of the device in the plane.

Figure 7:
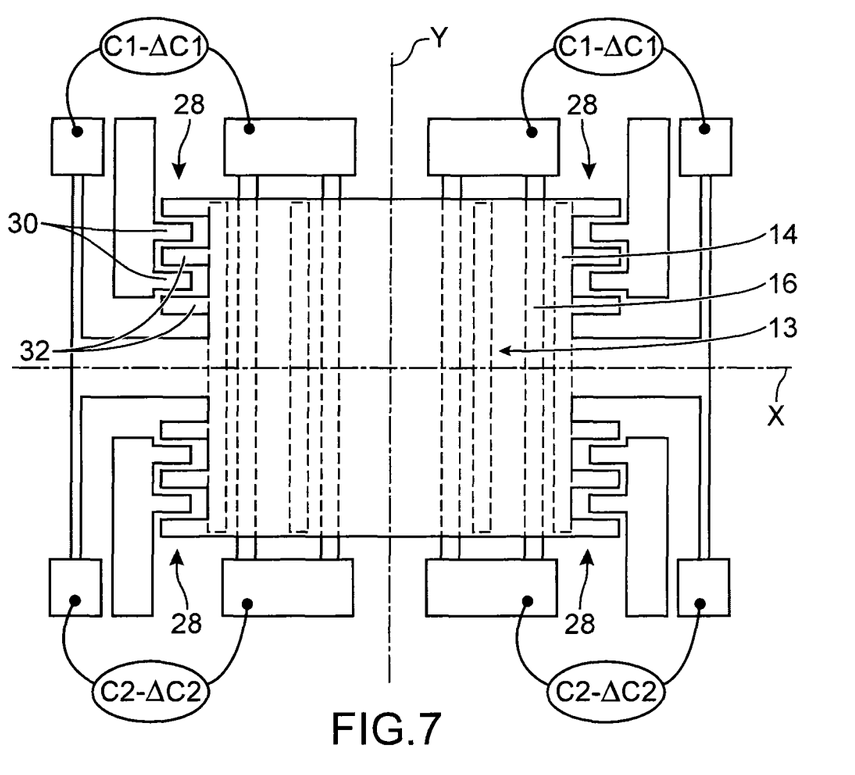
FIG. 7 is a top transparent view of another example of a device according to the invention adapted for example for producing a gyrometer.

FIG. 7 shows another embodiment of a capacitive device according to the invention comprising capacitive means that are both under the mobile element and on the side or sides of the mobile element.

In the example shown, the mobile portion has a structure similar to that of FIG. 1 and comprises lateral capacitive means 28 of the air gap change type. They comprise fixed electrodes 30 integral with the substrate and mobile electrodes 32 as a single piece with the mobile element 13 and protruding laterally from the edges of the mobile element. In this example, the mobile element has a parallelepiped shape. The mobile electrodes extend laterally on two edges opposite the mobile element 13. The mobile electrodes 32 are of a single piece with the mobile element 13. The mobile electrodes 32 and the fixed electrodes 30 are interdigitated. The electrodes are arranged in such a way that the direction of surface change is parallel to the air gap change between the electrodes 14 and 16. In the example shown the electrodes 30, 32 with surface change can make it possible to "supplement" the detection obtained thanks to the electrodes 14, 16 or to control the mobile element in position.

By using a decoupling framework in order to give a second degree of freedom well known in gyrometers and for example described in "*Micromachined gyroscope concept allowing interchangeable operation in both robust and precision modes*", Adam R. Schofield & Al., *Sensors and Actuators A* 165 (2011), pp 35-42), these lateral capacitive means 28 can be used to excite the structure, for example in order to set into vibration the mobile element in the case of a gyrometer where the excitation is done in a direction orthogonal to that of detection, and the electrodes 14 and 16 can be used for detection. It is possible for the electrodes 14 and 16 to be used for excitation and the lateral capacitive means to be used for detection.

Alternatively, these additional capacitive means can be used for controlling the position of the mobile element, for controlling the negative stiffness, for an additional detection of the movement of the mobile element, etc.

The additional capacitive means can be arranged with respect to the electrodes 14 and 16 in such a way that their air gaps vary simultaneously when the mobile element moves.

This structure has an footprint in the plane that is lower than that of the structures comprising both lateral detection and excitation means.

Figure 8:
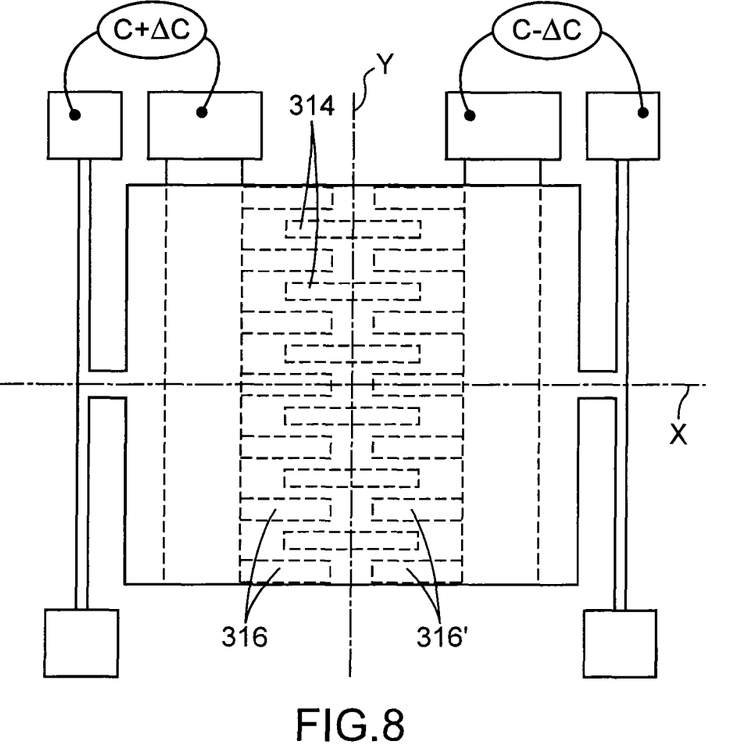
FIG. 8 is a top transparent view of another embodiment of a device according to the invention wherein the capacitive detection is via surface variation, FIGS. 9A to 9H diagrammatically show elements obtained during the various steps on an example embodiment according to the invention.

FIG. 8 shows another embodiment of a capacitive device according to the invention wherein the capacitive means are of the surface change type.

The fixed detection electrodes 316 and the mobile detection electrodes 314 are parallel to the direction of movement of the mobile element in order to form surface variable capacitors.

In the example shown, the mobile portion comprises mobile electrodes 314 arranged parallel to one another in the central zone of the mobile portion and interdigitated with two combs of fixed electrodes 316, 316' facing each other. In this example, the combs of fixed electrodes 316, 316' are anchored on the substrate, as in the example of FIGS. 5A and 5B.

Measuring the capacitance between the mobile electrodes 314 and the combs 316, 316' allows for a differential measurement, since, when the capacitance increases between the comb 316 and the mobile electrodes 314, that between the comb 316' and the mobile electrodes 314 decreases, which is symbolised by C+ΔC and C−ΔC.

The operations of the various examples and various alternatives are similar. When the mobile element in the case of an accelerometer, a geophone or a gyrometer for example is set into movement under the effect of an outside excitation, such as acceleration, vibration, the speed of rotation, etc. the latter tends to reduce or increase the air gap or the covering surface of the fixed electrodes and of the mobile electrodes. This air gap or surface change results in a capacitance change which is according to the movement of the mobile element.

The devices can operate in an open loop or in a closed loop more preferably.

It is possible to apply an operating mode that implements a negative electrostatic stiffness between the fixed portion and the mobile portion. This stiffness is controlled by a polarisation between the fixed combs and the mobile combs.

In the case of FIG. 7, this negative stiffness can be applied on the combs located on or under the mobile element as well as on the additional means.

The embodiments and alternative embodiments can be combined, for example it is possible to combine the device of FIG. 6 and that of FIG. 7, or to replace the devices with air gap change of FIG. 7 with those with surface change of FIG. 8 or those of FIGS. 4A, 4B or those of FIGS. 5A, 5B, or it is possible to have a device of FIG. 8 with capacitive means on and under the mobile element as is the case in FIG. 6.

Thanks to the invention, the capacitive device can have a very high degree of compactness while still offering good sensitivity, since it is possible to have a thick mobile element while still keeping thin air gaps. Indeed, the thickness of the air gap between the mobile electrodes and the fixed electrodes located on or under the mobile element can be fixed by etching in the case of interdigitated combs, with the fixed and mobile electrodes coming from the same layer which is a layer that can be thinner relatively to that which is required to carry out the mobile element. This thickness can be fixed precisely and be relatively low.

Furthermore, thanks to the thin air gaps, it is possible to increase the density of the number of electrodes and therefore to further increase the sensitivity. The invention therefore makes it possible to miniaturise the capacitive devices without degrading their performance, which makes it possible to reduce the cost of such devices.

Making via etching furthermore allows for good reproducibility and therefore to have good manufacturing efficiency.

Figure 10:
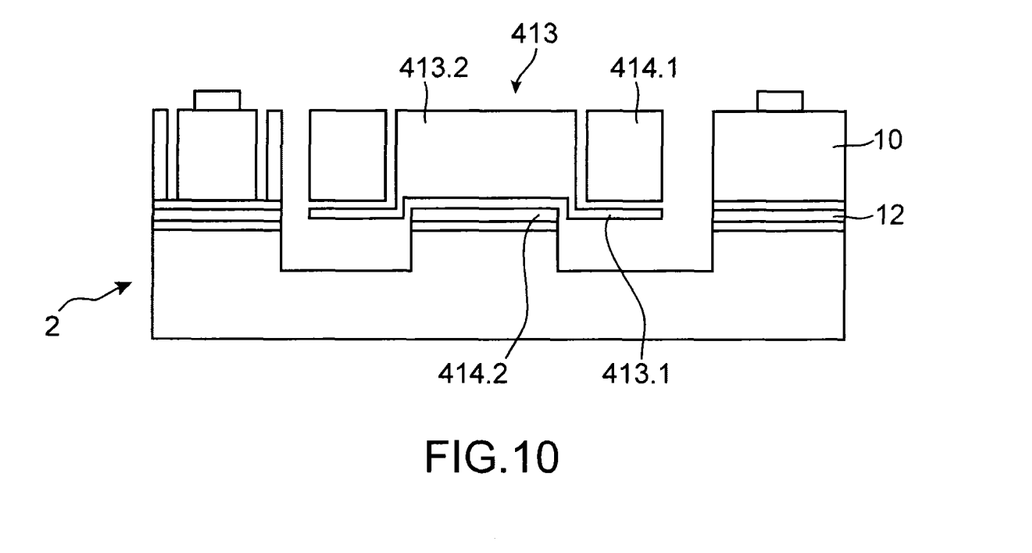
FIG. 10 is a transverse section view of an embodiment of a device according to the invention with movement out of the plane.

FIG. 10 shows an embodiment of a device with detection out of the plane.

The fixed electrodes are intended to detect an out-of-plane movement of the mobile element. They comprised of upper electrodes 414.1 located above the mobile element 413 and at least one lower electrode 414.2 located below the mobile element 413. In the example shown, the mobile element has, seen as a cross-section, the shape of a hat. The lateral edge 413.1 is arranged under the upper fixed electrodes 414.1 and the central portion 413.2 is arranged above the lower fixed electrode 414.2.

The air gap is fixed by a sacrificial layer. The fixed and mobile electrodes are realised partially in the layer 12 and partially in the layer 10.

Figure 11:
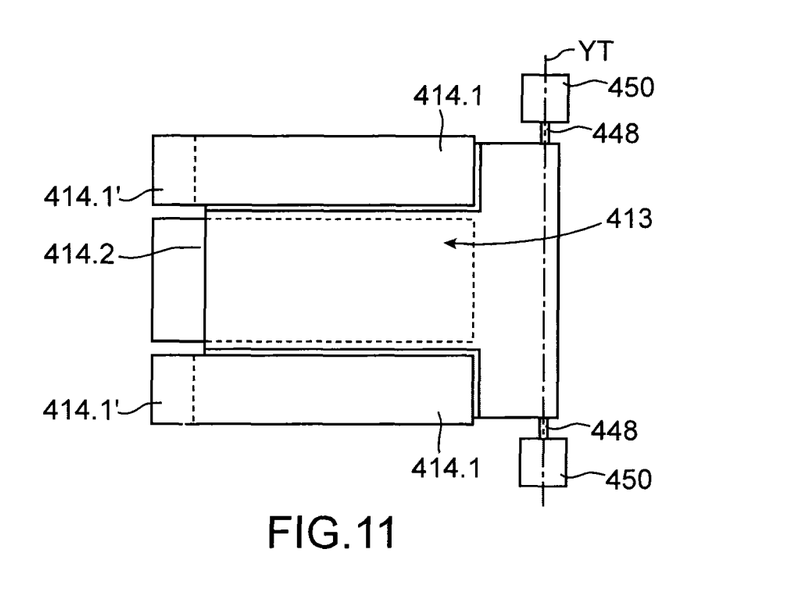
FIG. 11 is a top view of the device of FIG. 10 wherein the mobile element is suspended by beams stressed in torsion.

FIG. 11 shows a top view of a device with out-of-plane detection wherein the mobile element is suspended from the fixed portion by an axis of torsion YT. The axis of torsion is formed by two aligned beams 448 extending from two opposite faces of the mobile element, with the beams being connected to anchoring pads 450. The beams are stressed in torsion. The upper fixed electrodes 414.1 are anchored by a longitudinal end 414.1' to the fixed portion. As a variant, the upper fixed electrodes 414.1 could be anchored on the substrate over their entire length. For this, they could extend beyond the edges of the mobile mass in order to bear onto the substrate whereon is directly fixed the lower fixed electrode 414.2. The upper fixed electrodes would have a greater rigidity. The mobile element can therefore pivot about the axis YT. The beams 448 form torsion return springs.

Figure 12:
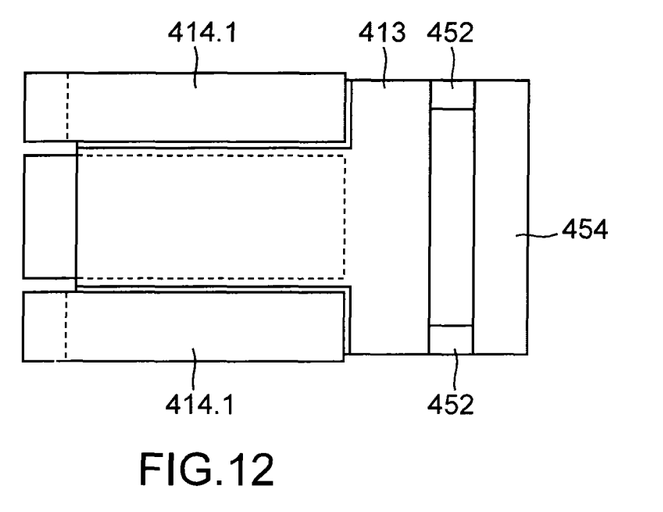
FIG. 12 is a top view of the device of FIG. 10 wherein the mobile element is suspended by beams stressed by bending.

FIG. 12 shows a top view of a device with out-of-plane detection wherein the mobile element is suspended from the fixed portion by the bending beams 452. The two beams 452 extend from a face of the mobile element, with the beams being connected to an anchoring pad 454. The beams 452 are stressed in bending and define an axis YF around which the mobile element pivots. The beams 452 form bending return springs.

The realisations of FIGS. 10 to 12 allow for a differential measurement of the movement of the mobile element.

As a variant, it could be considered that the mobile element has both a movement in the plane as well as a movement out of the plane by implementing a decoupling framework.

Furthermore, the electrodes described have a straight shape, but the latter is not in any way restrictive and any other form of electrodes, for example curved, do not leave the scope of this invention. In addition, the electrodes in the case of a detection by air gap change are not necessarily perpendicular to the direction of movement of the mobile portion, but could be inclined with respect to the latter.

An example embodiment shall now be described using FIGS. 9A to 9H.

Figure 9A:
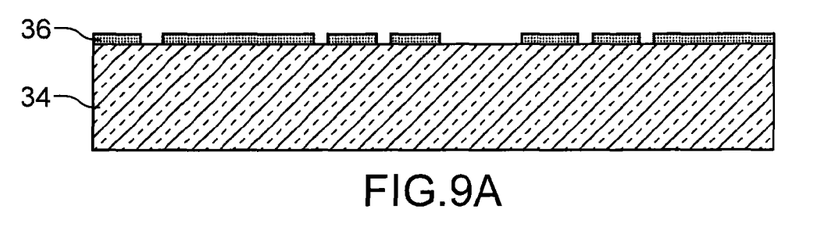

For example, first there is a first substrate 34 more preferably semi-conductive, for example made of silicon. The substrate 34 has for example a thickness of 750 µm. The latter is intended for the realisation of the mobile portion.

During a first step, a sacrificial layer 36 is formed on the substrate, for example made of oxide. This layer can be obtained by thermal oxidation. The sacrificial layer has for example a thickness of 1.5 µm.

The sacrificial layer 36 is then structured for example by lithography and by etching in order to open silicon zones which will allow the realisation of a contact with the following deposited or epitaxied layer.

The element obtained as such is shown in FIG. 9A.

Figure 9B:
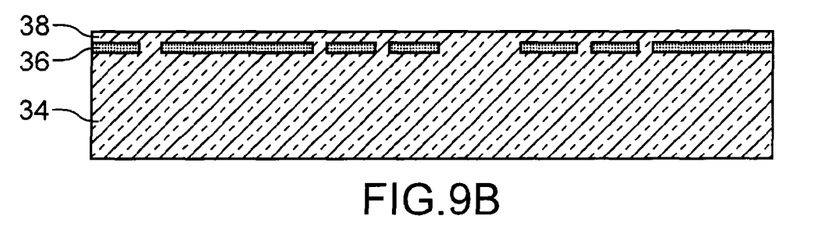

During a following step, a layer in semi-conductor for example made of polycrystalline or crystalline silicon 38 is formed on the structured sacrificial layer 36. It is for example made by silicon epitaxy. It has for example a thickness between a few µm and a few tens of µm.

The element obtained as such is shown in FIG. 9B.

Figure 9C:
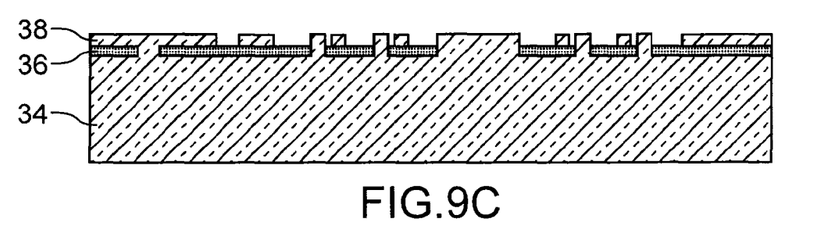

During a following step, the layer 38 is structured for example by lithography and then etching of the layer 38 in order to define both the fixed and the mobile detection electrodes. The etching stops on the oxide of the sacrificial layer 36.

The element I obtained as such is shown in FIG. 9C.

Figure 9D:
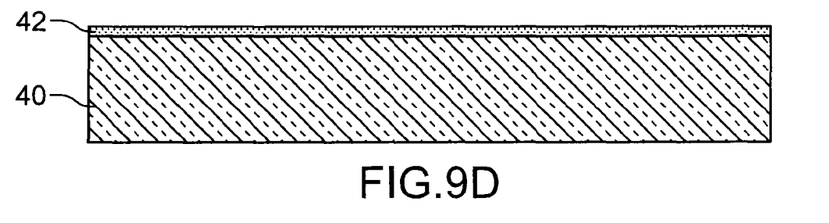

During a following step, on utilise a second substrate 40 intended to form the fixed portion.

The latter has for example a thickness of 750 µm, it is more preferably made of a semi-conductor, for example of silicon.

A sacrificial layer 42 for example made of oxide is formed on one of the faces of the substrate 40. It has for example a thickness of 1.5 µm. This layer can be obtained via thermal oxidation, etc.

The element obtained as such is shown on FIG. 9D.

Figure 9E:
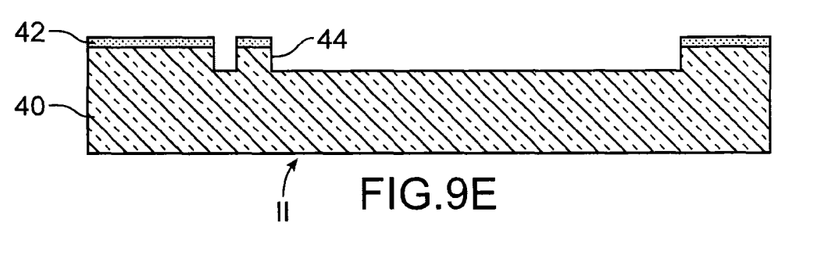

During a following step, the substrate 40 is structured in order to delimit a cavity. The structuring is for example created via lithography and etching of the sacrificial layer 42 then of the substrate 40, the etching takes place on a few µm and even a few tens of µm in order to define a cavity 44 which will be located under the mobile portion in the final device.

The element II obtained as such is shown in FIG. 9E.

Figure 9F:
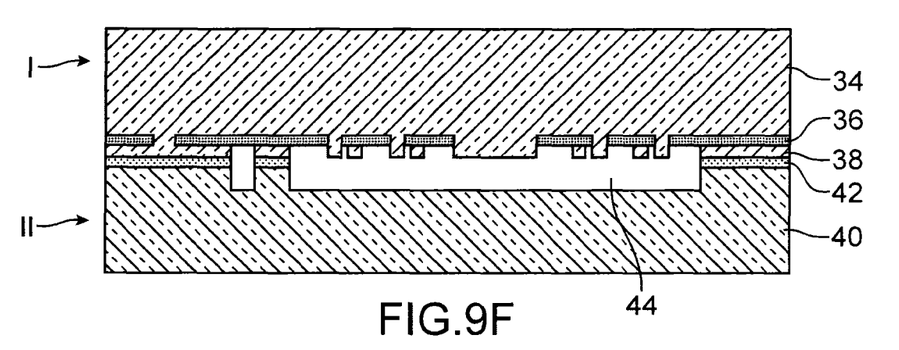

During a following step, the elements I and II are assembled in such a way that the structured face of the element I is facing the cavity 44 of the element II. The two elements are for example assembled, for example by sealing, for example by molecular adhesion.

The element obtained as such is shown in FIG. 9F.

Figure 9G:
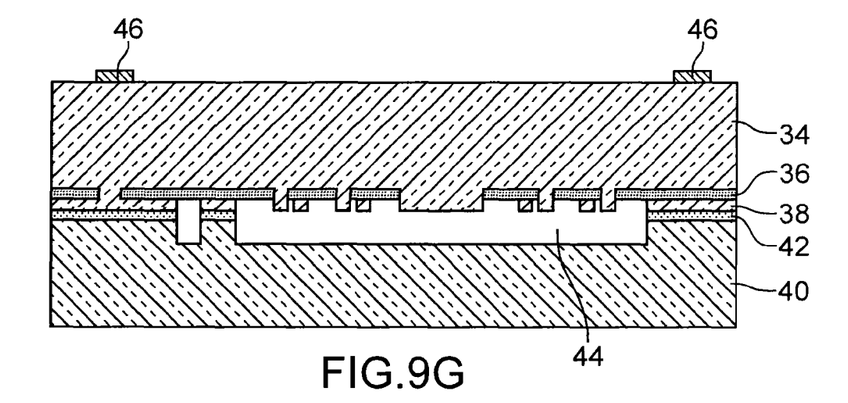

During a following step, the element II is thinned by its front face, for example by KOH etching or via mechanical rectification or abrasion (backgrinding) and mechanical-chemical polishing. This thinning makes it possible to define the thickness of the mobile portion which is typically between a few tens of µm and a few hundred µm.

During a following step, electrical contacts 46 are made on the front face, for this a metal layer is formed on the front face, for example via a deposit, it is then structured by lithography and etching.

The element obtained as such is shown in FIG. 9G.

Figure 9H:
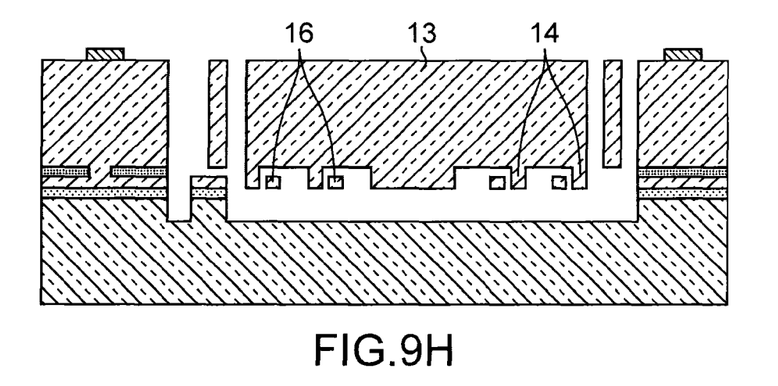

During a following step, the contour of the mobile portion and the contact pads are defined by lithography.

Then, the substrate 40 is etched, for example via deep etching, for example via deep reactive ion etching (DRIE) with stopping on the oxide.

The mobile portion is then released, by etching of the sacrificial layer 36 for example via hydrofluoric acid in vapour form. The fixed electrodes 16 are also detached from the mobile electrodes 14.

The element obtained as such is shown in FIG. 9H.

The fixed and mobile electrodes were indeed made from the same layer and their air gap was defined by etching.

In the case where it is sought to isolate the mobile electrodes from the mobile element (FIG. 3), during the etching of the sacrificial layer 26, the latter is not etched over its entire depth. As such, during the formation of the semi-conductive layer 28, a layer of oxide will subsist between the electrodes and the mass.

Figure 13:
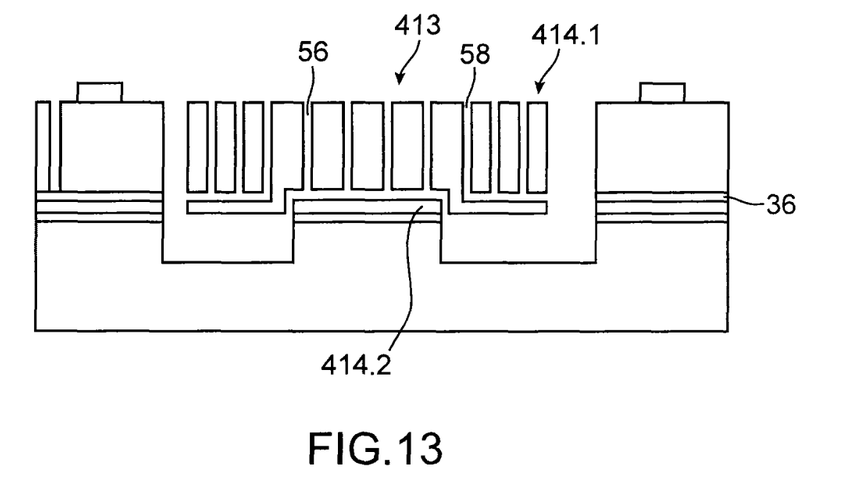
FIG. 13 is a transverse section view of another embodiment of a device according to the invention with movement outside of the plane provided with holes in the mobile element for the purpose of releasing it.

The method of realising a device with out-of-plane detection is similar to that described hereinabove, with the air gap being fixed by the layer of oxide 36. Holes 56 are provided to be arranged in the mobile element in order to provide for the removal of the layer 36 between the mobile element and the upper and lower electrodes. Holes 58 can possible be made in the upper fixed electrodes, as shown in FIG. 13.

The capacitive device according to the invention can for example be used in any sensor and any actuator of micrometric or nanometric size that uses electrostatic means of detection and/or actuating, such as accelerometers, gyrometers, geophones, etc., in particular those that implement structures with interdigitated combs.

The invention claimed is:

1. A device with a mobile element extending according to a given plane comprising at least one first layer, one second layer and one third layer extending in planes parallel to the given plane, with the first layer forming a support, the second layer comprising all or a portion of the mobile element and means for suspending the mobile element with respect to the support, the device also comprising at least one capacitor of which the capacitance varies according to the relative position of the mobile element with respect to the support, said capacitor comprising at least one mobile electrode secured to one of the faces of the mobile element parallel to the given plane, and at least one fixed electrode with respect to the support, the third layer comprising said at least one fixed electrode and said at least one mobile electrode, the fixed and mobile electrodes being arranged at least partially in the same plane parallel to the given plane and at least partially above and/or below the mobile element.

2. A device with a mobile element according to claim 1, wherein the second layer has a thickness greater than that of the third layer, the ratio between the thickness of the second layer and that of the third layer being advantageously at least equal to 2.

3. A device with a mobile element according to claim 1, comprising at least two mobile electrodes and two fixed electrodes which are interdigitated.

4. A device with a mobile element according to claim 1, wherein the third layer has a thickness between a few µm and a few tens of µm.

5. A device with a mobile element according to claim 1, comprising at least two mobile electrodes and at least two fixed electrodes arranged in such a way that when the capacitance between a fixed electrode and a mobile electrode increases, the capacitance between the other fixed electrode and the other mobile electrode decreases in order to take a differential measurement.

6. A device with a mobile element according to claim 1, wherein the mobile electrode is isolated electrically from the mobile element, said device comprising at least one connector for electrically connecting said mobile electrode.

7. A device with a mobile element according to claim 6, comprising several mobile electrodes and several fixed electrodes, at least one mobile electrode being connected electrically separately from the other mobile electrodes and/or at least one fixed electrode being connected electrically separately from the other fixed electrodes.

8. A device with a mobile element according to claim 1, wherein the fixed electrode is suspended with respect to the support.

9. A device with a mobile element according to claim 8, wherein the fixed electrode is suspended with respect to the support between a zone of the support covered by the mobile element and a zone of the support not covered by the mobile element.

10. A device with a mobile element according to claim 1, wherein the fixed electrode is anchored to the support.

11. A device with a mobile element according to claim 1, comprising at least one additional capacitor of which the capacitance varies according to the relative position of the mobile element and of the support, with said additional capacitor being arranged on the one hand in the second layer on at least one first lateral zone of the mobile element and on the other hand on a zone of the support which faces the at least one first lateral zone of the mobile element.

12. A device with a mobile element according to claim 11, wherein the additional capacitor is arranged on the one hand in the second layer on a second lateral zone of the mobile element opposite the first zone and on the other hand on a zone of the support facing the second lateral zone.

13. A device with a mobile element according to claim 11, wherein the capacitance of the capacitor varies when the mobile element is moved according to a first direction and the additional capacitor is arranged in such a way that their capacitance varies when the mobile element is moved according to a second direction different from the first direction, more preferably the second direction being orthogonal to the first direction.

14. A device with a mobile element according to claim 1, wherein the capacitor is a detector for detecting the relative position of the mobile portion and of the fixed portion.

15. A device with a mobile element according to claim 11, wherein the capacitive means and the additional capacitive means are means for detecting the relative position of the mobile element and of the support.

16. A device with a mobile element according to claim 11, wherein the capacitor among the capacitor and the additional capacitor is a detector for detecting the relative position of the mobile element and of the support and the other capacitor is either an actuator for actuating the mobile element with respect to the support or a generator for generating a negative electrostatic stiffness on the device.

17. A micro and/or nanoelectronic system comprising at least one device with mobile element according to claim 1.

18. A method for producing a device with a mobile element according to claim 1, comprising the steps of:
   A) structuring a conductive or semi-conductive layer formed on a first substrate in such a way as to form simultaneously at least one mobile electrode and at least one fixed electrode,
   B) assembling of the first substrate and of a second substrate,
   C) structuring of the first substrate in order to define the mobile element and the means of suspension, and
   D) releasing of the mobile element and release of the fixed electrode with respect to the mobile electrode.

19. A method according to claim 18, comprising prior to the step A):
   forming a sacrificial layer on the first substrate,
   structuring the sacrificial layer,
   forming the conductive or semi-conductive layer on said structured sacrificial layer.

20. A method according to claim 18, wherein the step B) is a step of sealing for example via molecular adhesion.

21. A method according to claim 18, wherein the step D) takes place by removing at least partially the sacrificial layer, for example via etching.

* * * * *